(12) United States Patent
Lin et al.

(10) Patent No.: US 9,848,152 B1
(45) Date of Patent: Dec. 19, 2017

(54) ANALOG DITHERING TO REDUCE VERTICAL FIXED PATTERN NOISE IN IMAGE SENSORS

(71) Applicant: OMNIVISION TECHNOLOGIES, INC., Santa Clara, CA (US)

(72) Inventors: Yingkan Lin, San Jose, CA (US); Yu-Shen Yang, San Jose, CA (US); Liping Deng, Cupertino, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/277,859

(22) Filed: Sep. 27, 2016

(51) Int. Cl.
 H04N 5/378 (2011.01)
 H03K 4/50 (2006.01)
 H03M 1/06 (2006.01)
 H03K 4/502 (2006.01)

(52) U.S. Cl.
 CPC ............ *H04N 5/378* (2013.01); *H03K 4/502* (2013.01); *H03M 1/0639* (2013.01)

(58) Field of Classification Search
 CPC .. H04N 5/378; H03M 1/0639; H03M 1/0641; H03K 4/502
 See application file for complete search history.

(56) References Cited

U.S. PATENT DOCUMENTS

| 5,493,298 | A  | * | 2/1996  | Bartz .................. H03M 1/0641 341/118 |
|-----------|----|---|---------|---------------------------------------------|
| 6,016,113 | A  | * | 1/2000  | Binder ................. H03M 1/201 341/120 |
| 6,552,746 | B1 | * | 4/2003  | Yang .................... H04N 1/195 250/208.1 |
| 7,075,466 | B1 | * | 7/2006  | Woodall .............. H03M 1/0629 341/131 |
| 7,277,033 | B1 | * | 10/2007 | Kriz ....................... H03M 1/06 341/131 |
| 8,717,208 | B2 |   | 5/2014  | Moore |
| 2003/0112163 | A1 | * | 6/2003 | Ercan .................... H03M 3/33 341/131 |
| 2006/0114144 | A1 | * | 6/2006 | Lyden ................. H03M 1/0641 341/161 |
| 2007/0109168 | A1 | * | 5/2007 | Hennessy ........... H03M 1/0639 341/155 |
| 2010/0207793 | A1 | * | 8/2010 | Ignjatovic ............ H03M 3/434 341/131 |
| 2014/0266309 | A1 | * | 9/2014 | Jakobson .............. H04N 5/378 327/63 |
| 2015/0333762 | A1 | * | 11/2015 | Drachmann ........ H03M 1/0639 374/170 |
| 2016/0373128 | A1 | * | 12/2016 | Wang .................. H03M 1/1009 |

\* cited by examiner

*Primary Examiner* — Timothy J Henn
(74) *Attorney, Agent, or Firm* — Christensen O'Connor Johnson Kindness PLLC

(57) ABSTRACT

Apparatuses and methods for reducing vertical fixed pattern noise in imaging systems are disclosed herein. An example apparatus may include an analog dithering circuit coupled to randomly add an offset voltage to a first reference voltage in response to a random binary signal during an analog to digital conversion operation, and a ramp generator circuit coupled to receive the first reference voltage, and provide a second reference voltage in response, wherein the randomly added offset voltage to the first reference is also present in the second reference voltage.

20 Claims, 3 Drawing Sheets

ANALOG DITHERING TO REDUCE VERTICAL FIXED PATTERN NOISE IN IMAGE SENSORS

TECHNICAL FIELD

This disclosure relates generally to image sensors, and in particular but not exclusively, relates to reduction/elimination of vertical fixed pattern noise in image sensors using analog dithering.

BACKGROUND INFORMATION

Image sensors have become ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices.

Various fixed pattern noise, such as vertical fixed pattern noise, may cause unwanted vertical stripes and bandings in an image. Such vertical fixed pattern noise may be caused by differences in the individual responsivity of column-centric circuits which readout voltages from pixels. Variations between the column-centric circuits may produce the unwanted variations in the image.

Many techniques have been employed to mitigate the effects of vertical fixed pattern noise and enhance image sensor performance. However, some of these methods may not entirely eliminate the effects of the vertical fixed pattern noise.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1:
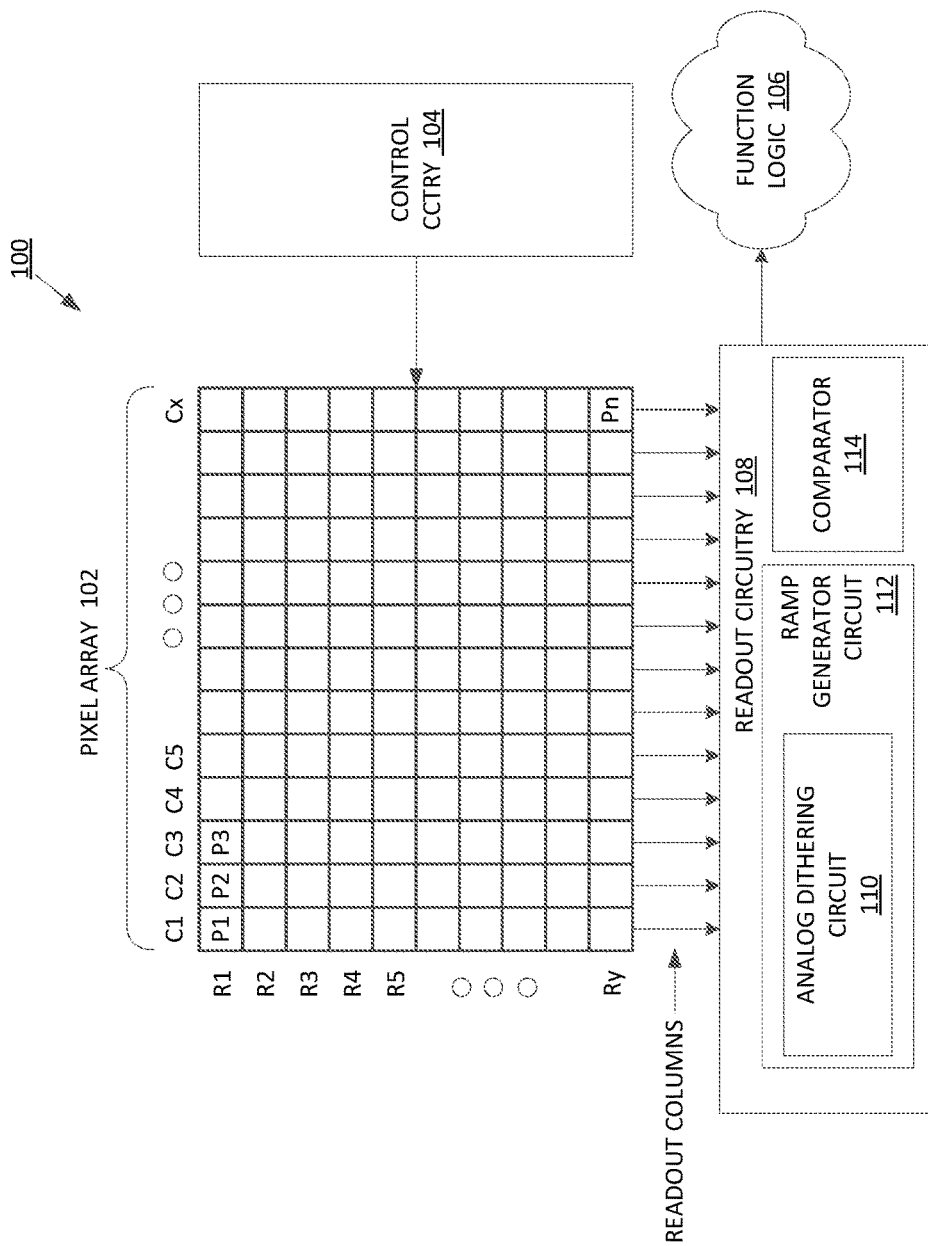
FIG. 1 illustrates one example of an imaging system in accordance with an embodiment of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for an image sensor an analog dithering circuit to reduce/eliminate vertical fixed pattern noise are described herein. In the following description, numerous specific details are set forth to provide a thorough understanding of the examples. One skilled in the relevant art will recognize; however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

FIG. 1 illustrates one example of an imaging system 100 in accordance with an embodiment of the present disclosure. Imaging system 100 includes pixel array 102, control circuitry 104, readout circuitry 108, and function logic 106. In one example, pixel array 102 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, photodiodes do not have to be arranged into rows and columns and may take other configurations.

In one example, after each image sensor photodiode/pixel in pixel array 102 has acquired its image data or image charge, the image data is readout by readout circuitry 108 and then transferred to function logic 106. Readout circuitry 108 may be coupled to readout image data from the plurality of photodiodes in pixel array 102. In various examples, readout circuitry 108 may include amplification circuitry, analog-to-digital (ADC) conversion circuitry, or otherwise. In some embodiments, one or more comparators 114 may be included for each of the readout columns. Function logic 106 may simply store the image data or even manipulate the image data by applying post image effects (e.g., crop, rotate, remove red eye, adjust brightness, adjust contrast, or otherwise). In one example, readout circuitry 108 may readout a row of image data at a time along readout column lines (illustrated) or may readout the image data using a variety of other techniques (not illustrated), such as a serial readout or a full parallel readout of all pixels simultaneously.

To perform ADC, for example, the readout circuitry 108 may receive a reference voltage VRAMP from a ramp generator circuit 112. VRAMP may be received by the comparator 114, which may also receive image charge from a pixel of the pixel array 102. The comparator 112 may determine a digital representation of the image charge based on a comparison of VRAMP to the image charge voltage level. The signal VRAMP may be at various voltage levels during the ADC operation, and may be used to reduce or eliminate any vertical fixed pattern noise (VFPN) generated during column readout. For example, a random noise signal may be added to VRAMP, which may be an analog dithering signal, to reduce or eliminate the effects of consistent column variations that generate the VFPN.

In some embodiments, the ramp generator circuit 112 may include an analog dithering circuit 110. The analog dithering circuit may randomly add an offset voltage to a reference voltage input of the ramp generator circuit 112. The offset voltage may be randomly added temporally-wise, and may appear on VRAMP provided by the ramp generator circuit 112. To the comparator 114, for example, the randomly added offset voltage may appear as random noise, which may be an analog dithering signal. The offset voltage may have a relatively small amplitude, at least with respect to the amplitude of the VFPN, and may additionally be comparable to the quantization noise generated during the ADC operation.

In one example, control circuitry 104 is coupled to pixel array 102 to control operation of the plurality of photodiodes in pixel array 102. For example, control circuitry 104 may generate a shutter signal for controlling image acquisition. In one example, the shutter signal is a global shutter signal for simultaneously enabling all pixels within pixel array 102 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects such as a flash.

In one example, imaging system 100 may be included in a digital camera, cell phone, laptop computer, or the like. Additionally, imaging system 200 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 100, extract image data from imaging system 100, or manipulate image data supplied by imaging system 100.

Figure 2:
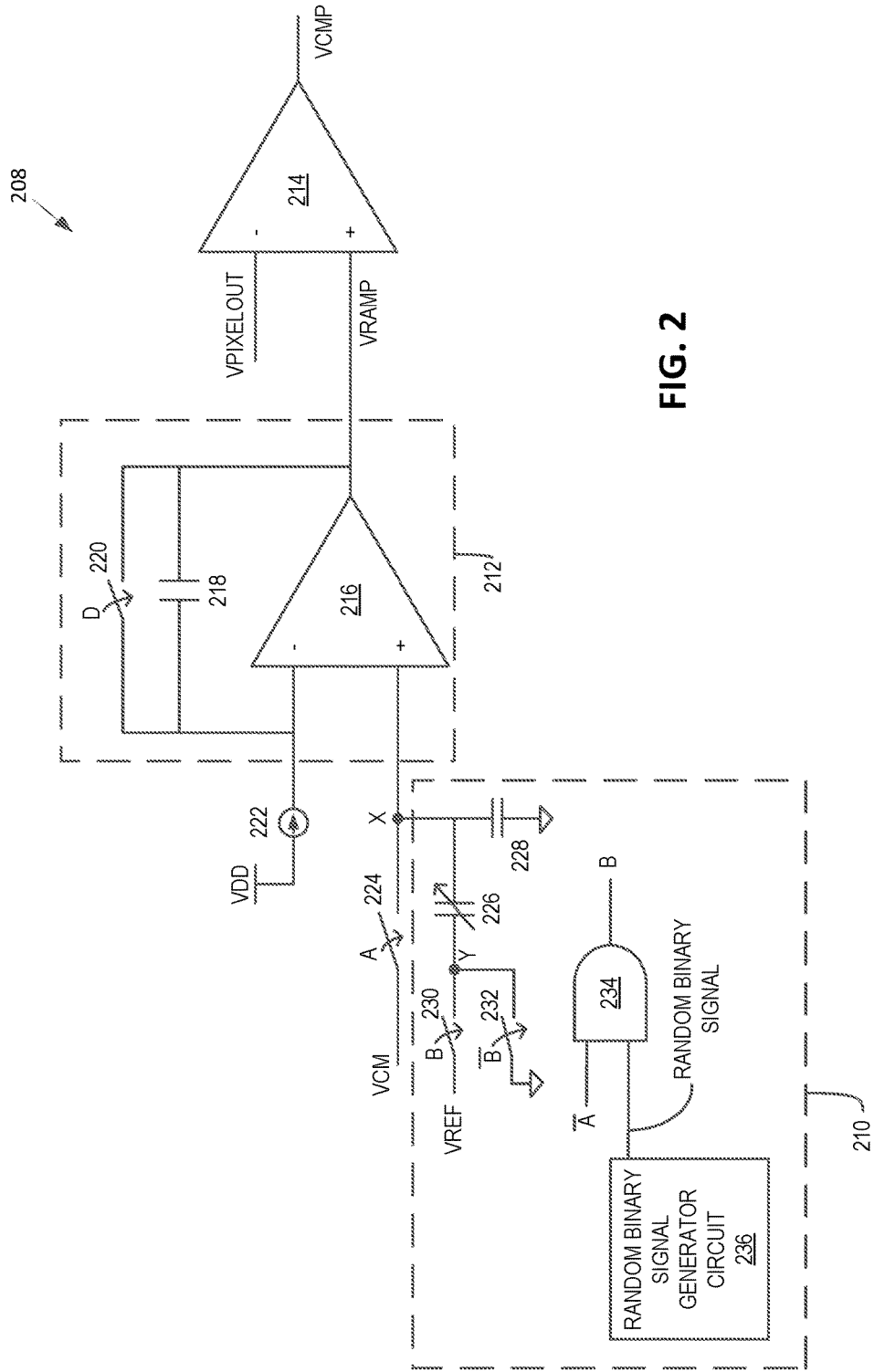
FIG. 2 is a schematic of readout circuitry in accordance with an embodiment of the present disclosure.

FIG. 2 is a schematic of readout circuitry 208 in accordance with an embodiment of the present disclosure. The readout circuitry 208 may be an example of the readout circuitry 108. The readout circuitry 208 may receive an image charge signal from a pixel, VPIXELOUT, and provide a comparison signal VCMP in response. VCMP may be a digital representation of the VPIXELOUT signal, for example. In some embodiments, an analog dithering technique may be employed by the readout circuitry 208 to reduce or eliminate VFPN.

The illustrated embodiment of the readout circuitry 208 includes a comparator 214, a ramp generator circuit 212, and an analog dithering circuit 210. The ramp generator 212 may receive a reference voltage VCM and provide a reference voltage VRAMP in response. During an ADC operation, the analog dithering circuit 210 may randomly add an offset voltage to VCM, where the randomness of the offset voltage is related to time aspect of the addition. The offset voltage may, in turn, propagate into VRAMP. The randomly added offset voltage on VRAMP may behave like random noise during the ADC performed by the comparator 214.

The comparator 214 may receive the image charge signal VPIXELOUT on an inverting input, and further receive VRAMP on a non-inverting input. During an ADC operation, the voltage signal VCMP may be provided by the comparator 214 in response to a comparison of VRAMP to VPIXELOUT. As noted, VCMP may be a digital representation of VPIXELOUT. The presence of the random noise in VRAMP due to the randomly added offset voltage to VCM may reduce or eliminate any VFPN generated during the ADC, for example.

The illustrated embodiment of the ramp generator circuit 220 includes an integrating buffer 216, a capacitor 218, and a switch 220. The switch 220 may be selectively controlled by a control signal D, which may be provided by control circuitry 104, for example. The switch 220 may be coupled between an output and an inverting input of the integrating buffer 216. The capacitor 218 may be coupled in parallel to the switch 220. Additionally, a current source 222 may be coupled to provide a current to the inverting input of the integrating buffer 216. A non-inverting input of the integrating buffer 216 may be coupled to receive the reference voltage VCM through a switch 224, and further coupled to receive an offset voltage generated by the analog dithering circuit 210. Reference voltage VCM may be a common mode voltage of an op amp, such as the integration buffer 216. For example, VCM may be around 1.8 volts. The switch 224 may be selectively controlled by a control signal A, which may be provided by control circuitry 104, for example.

The illustrated embodiment of the analog dithering circuit 210 includes capacitors 228 and 226, switches 230 and 232, an AND gate 234, and a random binary signal generator circuit 236. The capacitor 228 may be coupled between ground and a node X, which may be coupled to the non-inverting input of the integrating buffer 216 and the switch 224. The capacitor 226, which may be a variable capacitor, may be coupled to the node X on one side and node Y on the other. Switches 230 and 232 may additionally be coupled to node Y. The other side of switch 230 may be coupled to receive a reference voltage VREF, and the other side of switch 232 may be coupled to ground. Voltage VREF may be a base voltage for the analog dithering, e.g., the offset voltage. For example, VREF may be around 0.3 volts.

The offset voltage applied to node X may depend on the state of the switches 230 and 232. For example, if switch 232 is closed due to control signal /B being high, then ground may be capacitively coupled to node X. When control signal B is low, switch 230 may be open. However, when control signal B is high, which opens switch 232 and closes switch 230, VREF may be capacitively coupled to node X. With VREF coupled to the left side of capacitor 226, the offset voltage applied to node X may be based on the following equation: (VREF*C226)/(C226+C228). It should be noted that VCM may be stored on capacitor 228 as well. As such, the voltage on node X becomes VCM+(VREF*C226)/(C226+C228). Accordingly, VCM may increase by (VREF*C226)/(C226+C228), when VREF is capacitively coupled to node X. However, the offset voltage may be zero when ground is capacitively coupled to node X.

In some embodiments, the offset voltage may be adjusted based on changes to the variable capacitance 226. The capacitance value of capacitance 226 may be adjusted in response to the gain of the comparator 214, for example. In some embodiments, changes to the gain of the system, e.g., the comparator 214, may automatically adjust the capacitance value of the capacitance 226. The capacitance value may range from 25 fF to 200 fF, and the gain may be 1×, 2×, 4×, or 8×, for example.

The state of switches 230 and 232 may be randomly changed in response to control signal B. In turn, control signal B may randomly change in response to a random binary signal. Control signal B may be provided by an output of the AND gate 234, which may be coupled to receive control signal /A at one input and the random binary signal on the other. The random binary signal may be provided by the random binary signal generator 236. When /A is low, the output of the AND gate 234, and control signal B, may remain low. However, when /A is high, the output of the AND gate 234, and by extension control signal B, may change in accordance to the random binary signal. Control signal /A may be an enabling signal for the AND gate 234, for example. The random binary signal may randomly or pseudo-randomly fluctuate between a high and a low logic level. As such, the switches 230 and 232, which are controlled by control signal B and /B, respectively, may randomly and conversely open and close in accordance with the random binary signal. As such, the offset voltage may randomly change from zero to (VREF*C226)/(C226+C228), which results in the voltage on node X randomly changing from VCM+zero to VCM+(VREF*C226)/(C226+C228).

In operation, the switch 224 may be closed when control signal A is at a logic high, e.g., a "1," which may result in VCM being provided to the non-inverting input of the integrating buffer 216. Additionally, the capacitor 228 of the analog dithering circuit 210 may be charged to VCM. When control signal A is high, control signal D may be low, which may keep control switch 220 open. During this time, the capacitor 228 may be charged to VCM. However, since control switch 220 is open, the output of the integrating buffer 216 may remain constant, such as at VCM for example.

During an ADC operation, control signal D may be high, which may close switch 220. With switch 220 closed, feedback capacitor 218 may be bypassed, and a current path for current provided by the current source 222 may flow around the integrating buffer 216. As a result, VRAMP may linearly decrease from a maximum voltage, which may be based on VCM, until switch 220 is opened. The ADC operation may occur while VRAMP is linearly decreasing, for example.

Further, during the ADC conversion, control signal A may be low, which may result in switch 224 being opened. However, since capacitor 228 has been charged to VCM, VCM may continue to be provided to the non-inverting input of the integrating buffer 216. When control signal A is low, /A may be high, which may result in the input of the AND gate 234 being high, e.g., with the AND gate 234 enabled. As such, control signal B may randomly change between high and low in accordance with the random binary signal provided by the random binary signal generator circuit 236. As control signal B changes, switches 230 and 232 change between open and close, but opposite one another. As a result, the offset voltage applied to node X changes accordingly. The result may be the offset voltage randomly added in time to the voltage VCM. The random addition of the offset voltage to VCM may in turn be applied to VRAMP. The random addition of the offset voltage to VRAMP may act like noise to the input of the comparator 214, which may result with in limiting or preventing VFPN from appearing on VCMP.

While the random binary signal generator circuit 236 and the AND gate 234 are depicted as being part of the analog dithering circuit 210, the depiction is for illustration purposes only and should not be considered limiting. In some embodiments, the control signal B may be provided from outside the analog dithering circuit 210, such as by the control circuitry 104. In such an embodiment, the analog dithering circuit 210 may at least include the capacitors 226 and 228, and the switches 230 and 232. In other embodiments, the capacitor 228 may be included in a voltage sample and hold circuit, and the analog dithering circuit 210 may at least include the capacitor 226 and the switches 230 and 232.

Figure 3:
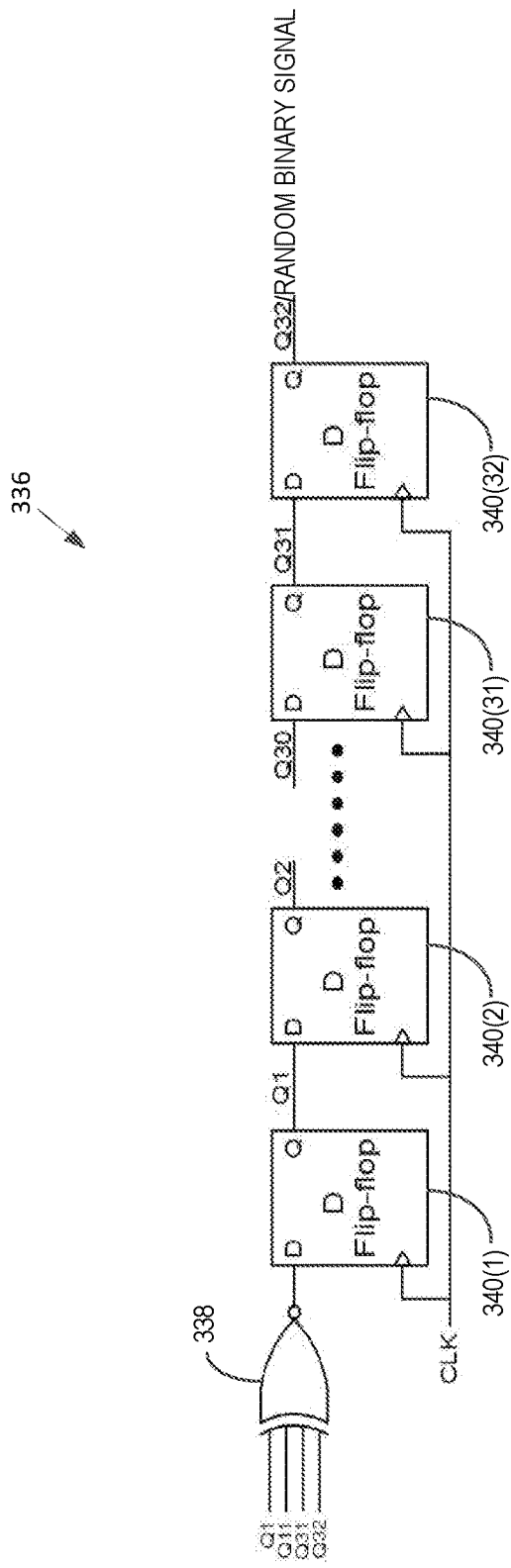
FIG. 3 is an illustration of a linear feedback shift register in accordance with an embodiment of the present disclosure.

FIG. 3 is an illustration of a linear feedback shift register 336 in accordance with an embodiment of the present disclosure. The linear feedback shift register (LFSR) 336 may be one implementation of the random binary signal generator circuit 236. The LFSR 336 may generate a random binary signal based on receiving a number of intermediate signals as an input, for example.

The illustrated embodiment of the LFSR 336 may include an exclusive NOR (XNOR) gate 380 and a plurality of stages 340, where each stage is a flip flop. For example, the plurality of stages may include 32 D flip flops 340(1) through 340(32). An input of a first stage, e.g., D flip flop 340(1), may be an output of the XNOR gate 380. In some embodiments, the XNOR gate 380 may be a four input XNOR gate with the inputs coupled to receive the output of four stages 340. For example, the XNOR gate 380 may receive the output of D flip flops 340(1), 340(11), 340(31), and 340(32) as inputs. The output of each stage 340 may be coupled to an input of a subsequent stage 340, and all of the plurality of stages 340 may be coupled to operate in response to the same clock signal CLK.

The sequence of binary bits generated by the LFSR 336 may, in some embodiments, be pseudo-random due to an eventual repeat of the sequence. However, by using four primitive feedback polynomials, e.g., the outputs of D flip flops 340(1), 340(11), 340(31), and 340(32), to generate an input to the LFSR 336, the output of the LFSR 336 may reach its maximum length, e.g., $2^n-1$, wherein n is the number of stages in the LFSR 336. This maximum length, e.g., $2^{32}-1$, may be long enough that the eventual repeat may not affect the randomness of application of the offset voltage, and therefore the reduction or elimination of the VFPN.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An apparatus, comprising:
    an analog dithering circuit coupled to randomly add an offset voltage to a first reference voltage in response to a random binary signal during an analog to digital conversion operation;
    a ramp generator circuit coupled to receive the first reference voltage, and provide a second reference voltage in response, wherein the randomly added offset voltage to the first reference is also present in the second reference voltage.

2. The apparatus of claim 1, wherein the offset voltage is temporally randomly added to the first reference voltage.

3. The apparatus of claim 1, wherein the analog dithering circuit randomly capacitively couples one of a third or fourth reference voltage to an input of the ramp generator circuit, the input of the ramp generator circuit additionally coupled to receive the first reference voltage, and wherein the offset voltage changes based on the one of the third or fourth reference voltages randomly coupled to the input of the ramp generator circuit.

4. The apparatus of claim 3, wherein the analog dithering circuit comprises:
   a first switch coupled between the third reference voltage and a first node, wherein the first switch is selectively controlled by a second control signal;
   a second switch coupled between the fourth reference voltage and the first node, wherein the second switch is selectively controlled by an inverse of the second control signal;
   a first capacitor coupled between the input of the ramp generator circuit and ground, the second capacitor coupled to store the first reference voltage; and
   a second capacitor coupled between the input of the ramp generator circuit and the first node,
   wherein the second control signal randomly changes in response to a random binary signal during the analog to digital conversion, and wherein the random changes randomly coupled the third or fourth reference voltage to the first node.

5. The apparatus of claim 4, wherein the analog dithering circuit further comprises:
   a logic gate coupled to receive a random binary signal and an inverse of a first control signal, an output of the logic gate changing in response to the random binary signal and the inverse of the first control signal, wherein the output of the logic gate is the second control signal; and
   a random binary signal generator coupled to provide the random binary signal.

6. The apparatus of claim 5, wherein the logic gate is an AND gate.

7. The apparatus of claim 5, wherein the random binary signal generator circuit is a linear feedback shift register including a plurality of flip flops coupled in series and coupled to receive a plurality of intermediate outputs as an input via an exclusive NOR gate, and wherein an output of the linear feedback shift register is the random binary signal.

8. The apparatus of claim 5, wherein the offset voltage is based at least in part on the first and second capacitors.

9. An imaging system, comprising:
   an array of pixels, wherein a pixel in the array of pixels is to receive image light and provide image charge in response;
   column readout circuitry coupled to receive the image charge and provide a digital representation of the image charge in response to a digital to analog conversion operation, the column readout circuitry including:
      a comparator coupled to receive the image data and a ramp voltage, and provide the digital representation of the image charge in response;
      a ramp generator coupled to receive a first reference voltage and provide the ramp voltage in response; and
      an analog dithering circuit coupled to randomly add an offset voltage to the first reference voltage during the analog to digital conversion operation.

10. The imaging system of claim 9, wherein the randomly added offset voltage appears as noise on the ramp voltage.

11. The imaging system of claim 9, wherein the offset voltage is either zero, or a voltage level that is less than a voltage level of vertical fixed pattern noise.

12. The imaging system of claim 9, wherein the analog dithering circuit includes:
   a first switch coupled between the third reference voltage and a first node, wherein the first switch is selectively controlled by a second control signal;
   a second switch coupled between the fourth reference voltage and the first node, wherein the second switch is selectively controlled by an inverse of the second control signal;
   a first capacitor coupled between the input of the ramp generator circuit and ground, the second capacitor coupled to store the first reference voltage; and
   a second capacitor coupled between the input of the ramp generator circuit and the first node,
   wherein the second control signal randomly changes in response to a random binary signal during the analog to digital conversion, and wherein the random changes randomly coupled the third or fourth reference voltage to the first node, and
   wherein the offset voltage is based at least in part on the first and second capacitors.

13. The imaging system of claim 12, wherein the analog dithering circuit further comprises:
   an AND gate coupled to receive a random binary signal and an inverse of a first control signal, an output of the AND gate changing in response to the random binary signal and the inverse of the first control signal, wherein the output of the AND gate is the second control signal; and
   a random binary signal generator coupled to provide the random binary signal.

14. The imaging system of claim 13, wherein the random binary signal generator is a linear feedback shift register including 32 D flip flops, wherein an input to the linear feedback shift register is an output of an exclusive NOR gate coupled to receive outputs from four of the 32 D flip flops, and wherein an output of the linear feedback shift register is the random binary signal.

15. The imaging system of claim 12, wherein the random binary signal is pseudo random.

16. A method to add random noise to a ramp voltage, comprising:
   receiving a first reference voltage at an input of a ramp generator;
   randomly adding an offset voltage to the first reference voltage during an analog to digital conversion operation;
   receiving a second reference voltage at a first input of a comparator, wherein the second reference voltage is provided by the ramp generator and includes the randomly added offset voltage;
   receiving an image data at a second input of the comparator; and
   comparing the image data to the second reference voltage to provide a digital representation of the image data during the analog to digital conversion operation.

17. The method of claim 16, wherein randomly adding an offset voltage to the first reference voltage during an analog to digital conversion operation comprises:
   randomly capacitively coupling one of a third reference voltage or a fourth reference voltage to the input of the ramp generator.

18. The method of claim 17, wherein randomly capacitively coupling one of a third reference voltage or a second reference voltage to the input of the ramp generator comprises:
   randomly coupling a first side of a first capacitance to either the third reference voltage or the fourth reference voltage in response to a random binary signal, wherein a second side of the first capacitance is coupled to the input of the ramp generator.

19. The method of claim 18, wherein the offset voltage is based at least in part on the first capacitance and a second capacitance, the second capacitance coupled between to the input of the ramp generator and ground, and wherein the second capacitance is charged to store the first reference voltage.

20. The method of claim 16, wherein randomly adding an offset voltage to the first reference voltage during an analog to digital conversion operation, comprises:
 generating a random binary signal;
 inversely actuating first and second switches in response to the random binary signal, wherein the first and second switches are coupled between third and fourth reference voltages, respectively, and a first capacitance, wherein the second capacitance is coupled between the first and second switches and an input of a ramp generator,
 wherein a second capacitance is coupled between ground and the input of the ramp generator, and
 wherein the offset voltage is based on the state of the first and second switches, voltage levels of the third and fourth voltages, and the first and second capacitances.

\* \* \* \* \*